(12) United States Patent
Gomm et al.

(10) Patent No.: US 7,855,585 B2
(45) Date of Patent: Dec. 21, 2010

(54) LOCAL COARSE DELAY UNITS

(75) Inventors: Tyler J. Gomm, Boise, ID (US); Kang Yong Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/410,545

(22) Filed: Mar. 25, 2009

(65) Prior Publication Data

US 2009/0179676 A1    Jul. 16, 2009

Related U.S. Application Data

(62) Division of application No. 11/450,630, filed on Jun. 9, 2006, now Pat. No. 7,525,354.

(51) Int. Cl.
*H03L 7/06* (2006.01)

(52) U.S. Cl. ........................ 327/158; 327/159

(58) Field of Classification Search ............ 327/158
See application file for complete search history.

(56) References Cited

U.S. PATENT DOCUMENTS

| | | | |
|---|---|---|---|
| 6,774,690 B2 | 8/2004 | Baker et al. | |
| 6,812,760 B1 | 11/2004 | Kim et al. | |
| 6,836,166 B2 | 12/2004 | Lin et al. | |
| 7,282,973 B1 | 10/2007 | Charagulla et al. | |
| 2006/0001465 A1* | 1/2006 | Kwak et al. | 327/160 |
| 2007/0011483 A1 | 1/2007 | Lin | |

OTHER PUBLICATIONS

United States Patent and Trademark Office Communication for related U.S. Appl. No. 11/450,630 dated Dec. 4, 2007 (6pgs.).
Applicant's Response dated Dec. 21, 2007 to Examiner's Office Communication dated Dec. 4, 2007 (16 pgs.).
United States Patent and Trademark Final Office Action for related U.S. Appl. No. 11/450,630 dated Feb. 13, 2008 (12 pgs.).
Applicant's Amendment and Response dated Feb. 21, 2008 to Examiner's Office Action dated Feb. 13, 2008 (19 pgs.).

(Continued)

*Primary Examiner*—Lincoln Donovan
*Assistant Examiner*—Daniel Rojas
(74) *Attorney, Agent, or Firm*—Brooks, Cameron & Huebsch, PLLC

(57) ABSTRACT

One delay locked loop circuit embodiment includes a delay line system configured to generate a clock output signal by adding a delay line system time delay to a clock reference signal, a phase detector, a shift register, and a control unit. The delay line system includes a coarse delay line to adjust the delay line system time delay by remote coarse-shifting, a phase selector configured to adjust the delay line system time delay by local coarse-shifting output signals from a series of local coarse delay units, and a phase mixer to adjust a particular time delay of the clock output signal by fine-shifting. The phase mixer does not receive the clock reference signal. The phase detector detects a phase difference between the clock reference signal and the clock output signal. The shift register controls the remote coarse-shifting, and the control unit controls the local coarse-shifting, based on the phase difference.

19 Claims, 5 Drawing Sheets

OTHER PUBLICATIONS

United States Patent and Trademark Final Office Action for related U.S. Appl. No. 11/450,630 dated May 30, 2008 (15 pgs.).
Applicant's Amendment and Response dated Jun. 19, 2008 to Examiner's Final Office Action dated May 30, 2008 (18 pgs.).
United States Patent and Trademark Final Office Action for related U.S. Appl. No. 11/450,630 dated Jul. 3, 2008 (12 pgs.).
Applicant's Amendment and Response dated Aug. 6, 2008 to Examiner's Final Office Action dated Jul. 3, 2008 (21 pgs.).

* cited by examiner

LOCAL COARSE DELAY UNITS

PRIORITY INFORMATION

This application is a Divisional of U.S. patent application Ser. No. 11/450,630 filed Jun. 9, 2006, the specification of which is incorporated by reference herein.

TECHNICAL FIELD

The present disclosure relates generally to delay locked loops and more particularly to delay line systems in delay locked loops.

BACKGROUND

In various applications, it can be useful to delay the transmission of an electrical signal. For example, such delayed transmissions can be used to synchronize signals for various circuits. This synchronization allows integrated circuits to work properly. The transmission of an electrical signal can be delayed in various ways.

A delay unit (DU) is an electrical element that can delay the transmission of an electrical signal. A DU can receive a signal and then, after a time delay, generate a delayed signal. The delayed signal generated by the DU can have the same properties as the signal received by the DU, except that the delayed signal can have the time delay added by the DU. A particular DU can have a time delay that is a fixed amount of time, however different DUs can have different time delays. A coarse DU (CDU) can have a relatively longer time delay than a fine DU (FDU). As examples, a CDU may have a time delay of 200 picoseconds and a FDU may have a time delay of 12.5 picoseconds. However, CDUs and FDUs of various time delays are available.

A delay line (DL) is an electrical element that can delay the transmission of an electrical signal by using one or more DUs connected together in a line of DUs. A DL can receive a signal and then, after a time delay, generate a delayed signal. A particular DL can have time delays for varied amounts of time. The time delay of a DL can be varied by electrically shifting one or more DUs into or out of the line of DUs used by the DL. A DL can use none of the DUs in a line of DUs, to generate a signal with a time delay of zero. A coarse DL (CDL) with a line of CDUs can have relatively longer time delays than a fine DL (FDL) with a line of FDUs. As an example, a CDL may use a line of ninety-six CDUs, each with a time delay of 200 picoseconds, for time delays in increments of 200 picoseconds. As another example, a FDL may use a line of sixteen FDUs, each with a time delay of 12.5 picoseconds, for time delays in increments of 12.5 picoseconds.

A DL system is an electrical system that can delay the transmission of an electrical signal by using one or more DLs connected together. A DL system can include one or more CDLs and/or one or more FDLs and/or one or more other electrical elements. A particular DL system can have time delays for varied amounts of time. The time delay of a DL system can be varied by electrically shifting one or more DUs into or out of one or more DLs of the DL system.

Throughout this document, electrically shifting a CDU into or out of a CDL in a DL system is referred to as "remote coarse-shifting" and electrically shifting an FDU into or out of an FDL in a DL system is referred to as "fine-shifting." Remote coarse-shifting can cause issues in a DL and/or a DL system. A remote coarse-shift can consume a significant amount of power for an integrated circuit. For example, a remote coarse-shift can draw instantaneous current on the order of one milli-amp. The power consumption from a remote coarse-shift can also adversely affect a power supply for the DL and/or the DL system, e.g. this can cause jitter in the delayed electrical signal generated by the DL and/or the DL system. Such jitter can disturb the synchronization of an integrated circuit, causing it to work improperly.

DETAILED DESCRIPTION

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1:
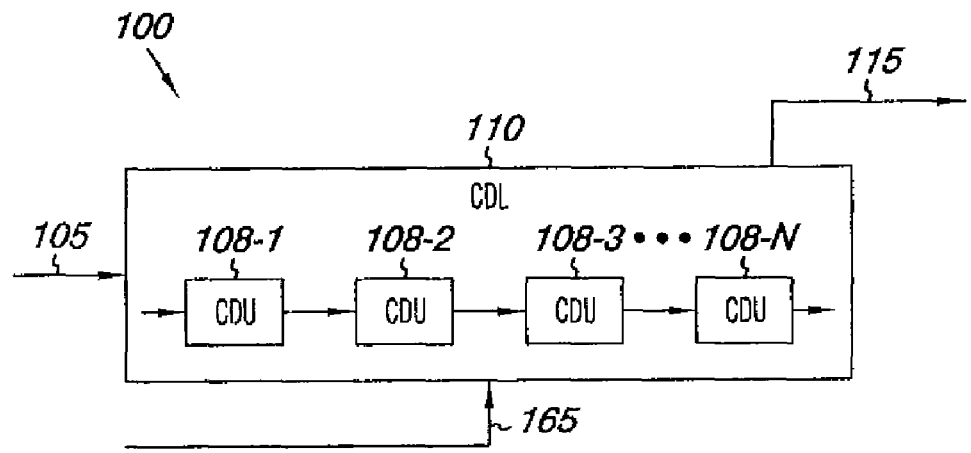
FIG. 1 illustrates an embodiment of a CDL according to teachings of the prior art.

FIG. 1 illustrates an embodiment 100 of a CDL 110 according to teachings of the prior art. The CDL 110 includes a number of CDUs 108-1, 108-2, . . . 108-N (where "N" is a scalable number). The embodiment 100 includes a clock reference signal 105, a clock output signal 115, and a shift register signal 165. In the embodiment 100, the CDL 110 is an exit point CDL, although the prior art also teaches entry point CDLs.

The CDL 110 can delay the transmission of the clock reference signal 105 by using one or more of the CDUs 108-1, . . . 108-N. The CDL 110 can receive the clock reference signal 105 and then, after a time delay, generate the clock output signal 115. The clock output signal 115 can have the same properties as the clock reference signal 105, except that the clock output signal 115 can have the time delay added by the one or more CDUs. Alternatively, the CDL 110 can use none of the CDUs 108-1, . . . 108-N in the line of CDUs, to generate the clock output signal 115 with a time delay of zero. In various embodiments of the present disclosure, the CDL 110 can be used as a CDL 210 of the embodiment of FIG. 2, as a CDL 310 of the embodiment of FIG. 3, and/or as a CDL 510 of the embodiment of FIG. 5.

Figure 2:
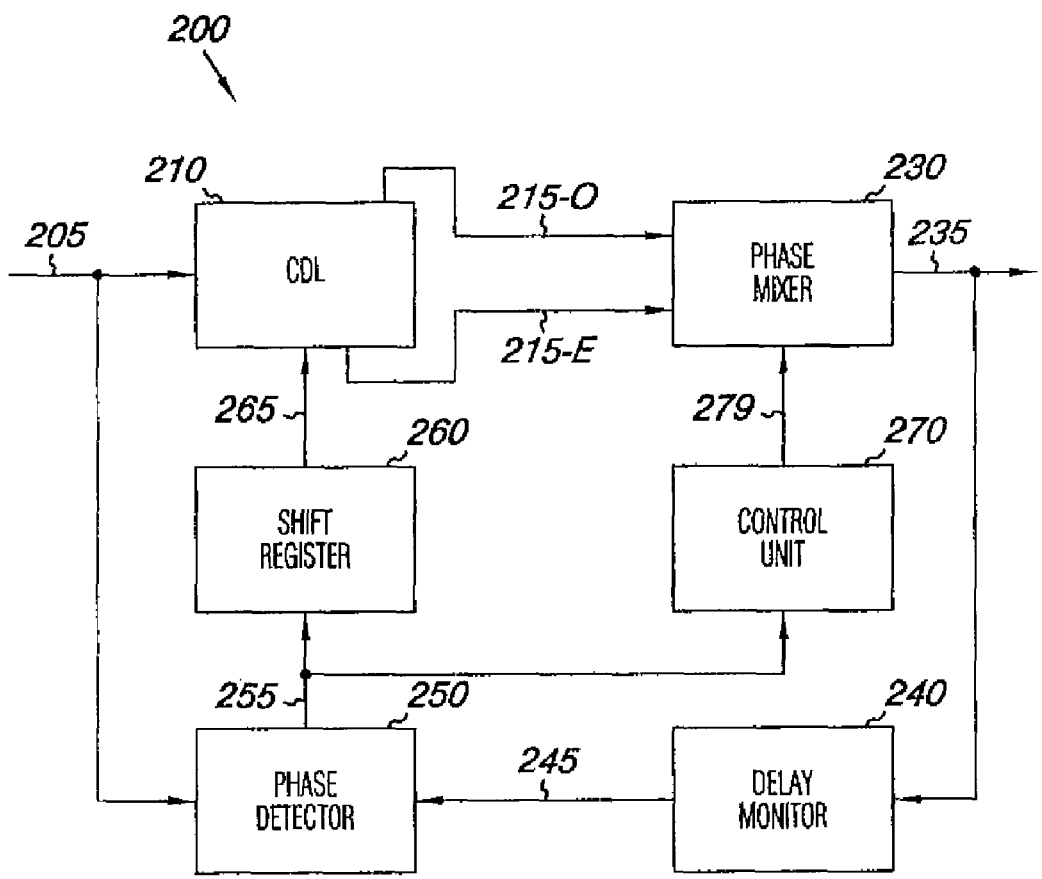
FIG. 2 illustrates an embodiment of a delay locked loop (DLL) circuit.

FIG. 2 illustrates an embodiment of a delay locked loop (DLL) circuit 200. A DLL circuit includes electrical elements arranged in a loop. The DLL circuit 200 includes a CDL 210 and a phase mixer 230 (also referred to as a "fine adjust circuit"), which together can be considered a DL system within the DLL circuit 200. The DLL circuit 200 also includes a delay monitor 240, a phase detector 250, a shift register 260, and a control unit 270. A DLL circuit can phase lock an output signal to a reference signal. The DLL circuit 200 can phase lock a clock output signal 235 to a clock reference signal 205 by using electrical elements included in the DLL circuit 200.

The CDL 210 can receive the clock reference signal 205 and a shift register signal 265. The shift register signal 265 can vary a time delay of the CDL 210 by controlling remote (e.g. in the CDL 210) coarse-shifting. The CDL 210 can generate an odd CDL output signal 215-O and an even CDL output signal 215-E, each of which can be based on the clock reference signal 205 and can include a time delay of the CDL 210. An example of an exit-point CDL generating an odd CDL output signal and an even CDL output signal is provided in co-pending commonly assigned U.S. application Ser. No. 11/349,397, entitled "Delay Line Circuit", filed Feb. 6, 2006 and in co-pending commonly assigned U.S. application Ser. No. 11/186,548, entitled "Seamless Coarse and Fine Delay Structure for High Performance DLL", filed Jul. 21, 2005, both with a common inventor to the present application. In the embodiment of FIG. 2, the CDL 210 is shown as an exit point CDL, such as the CDL 110 of the embodiment of FIG. 1. However, in various embodiments the CDL 210 can be an entry point CDL.

The phase mixer 230 can receive the odd CDL output signal 215-O, the even CDL output signal 215-E, and a control unit output signal 279. The control unit output signal 279 can vary a time delay of the phase mixer 210 by controlling fine-shifting in the phase mixer 210. The phase mixer 230 can generate the clock output signal 235, which can be based on the odd CDL output signal 215-O and/or the even CDL output signal 215-E and can include a time delay of the phase mixer 230. In some instances, the time delay of the phase mixer 230 can be zero. The time delay of the phase mixer 230 can be used with a time delay of the CDL 210 to generate a time delay for the DL system that includes the CDL 210 and the phase mixer 230. The time delay for this DL system can also be considered the time delay for the DLL circuit 200.

The delay monitor 240 can receive the clock output signal 235, monitor a phase delay in the clock output signal 235, and generate a delay monitor output signal 245. The phase detector 250 can receive the delay monitor output signal 245 and the clock reference signal 205. The phase detector 250 can use the clock reference signal 205 and the delay monitor output signal 245 to detect a phase difference between the clock reference signal 205 and the clock output signal 235. The phase detector 250 can generate a phase detector output signal 255 based on the detected phase difference.

The shift register 260 can receive the phase detector output signal 255 and can generate the shift register output signal 265. The shift register 260 can control remote coarse-shifting in the CDL 210 in response to the phase detector output signal 255. Thus, the shift register 260 can control remote coarse-shifting in the CDL 210 in response to a phase difference between the clock reference signal 205 and the clock output signal 235 to establish and/or maintain a phase lock between the clock output signal 235 and the clock reference signal 205.

For example, if the phase detector output signal 255 indicates that the clock output signal 235 leads the clock reference signal 205 by a particular phase difference, then the shift register 260 can generate a shift register output signal 265 that remote coarse-shifts one or more CDUs into the line of CDUs in the CDL 210, increasing the time delay of the CDL output signal(s) 215-O and/or 215-E, thus increasing the time delay of the clock output signal 235 and reducing the phase difference between the clock reference signal 205 and the clock output signal 235.

Also as an example, if the phase detector output signal 255 indicates that the clock output signal 235 lags the clock reference signal 205 by a particular phase difference, then the shift register 260 can generate a shift register output signal 265 that remote coarse-shifts one or more CDUs out of the line of CDUs in the CDL 210, decreasing the time delay of the CDL output signal(s) 215-O and/or 215-E, thus decreasing the time delay of the clock output signal 235 and reducing the phase difference between the clock reference signal 205 and the clock output signal 235.

The control unit 270 can receive the phase detector output signal 255 and can generate the control unit output signal 279. The control unit 270 can control fine-shifting in the phase mixer 230 in response to the phase detector output signal 255. Thus, the control unit 270 can control fine-shifting in the phase mixer 230 in response to a phase difference between the clock reference signal 205 and the clock output signal 235 to establish and/or maintain a phase lock between the clock reference signal 205 and the clock output signal 235.

In various embodiments, the DLL circuit 200 can include logic to coordinate remote coarse-shifting by the CDL 210 and fine-shifting by the phase mixer 230 across fine-to-coarse time delay boundaries. As an example, the CDL 210 may use ninety-six 200 picosecond CDUs and the phase mixer 230 may use sixteen 12.5 picosecond FDUs. Combinations of the 200 picosecond CDUs and the 12.5 picosecond FDUs may be used for time delays of the DL system in 12.5 picosecond increments. However, this range includes fine-to-coarse boundaries at multiples of 200 picoseconds, for the CDL 210. At each of these fine-to-coarse boundaries, logic in the DLL circuit 200 can remote coarse-shift a CDU in exchange for fine-shifting one or more FDUs.

As mentioned in the Background, with previous fine adjust/coarse adjust DLL delay line topology, there exists the potential for a DL to phase lock onto a fine-to-coarse boundary. Given some amount of jitter in the clock reference signal, it may be difficult to prevent slight changes in the phase lock point of a DLL. If these changes cause the DLL to move back and forth across a fine-to-coarse boundary, the CDL will periodically shift causing large drivers for shifting to fire. This remote coarse shifting injects voltage variation on the DLL power supply, causing additional momentary jitter on a clock output signal. In addition, this periodic remote coarse shifting increases power consumption in the DLL.

Figure 3:
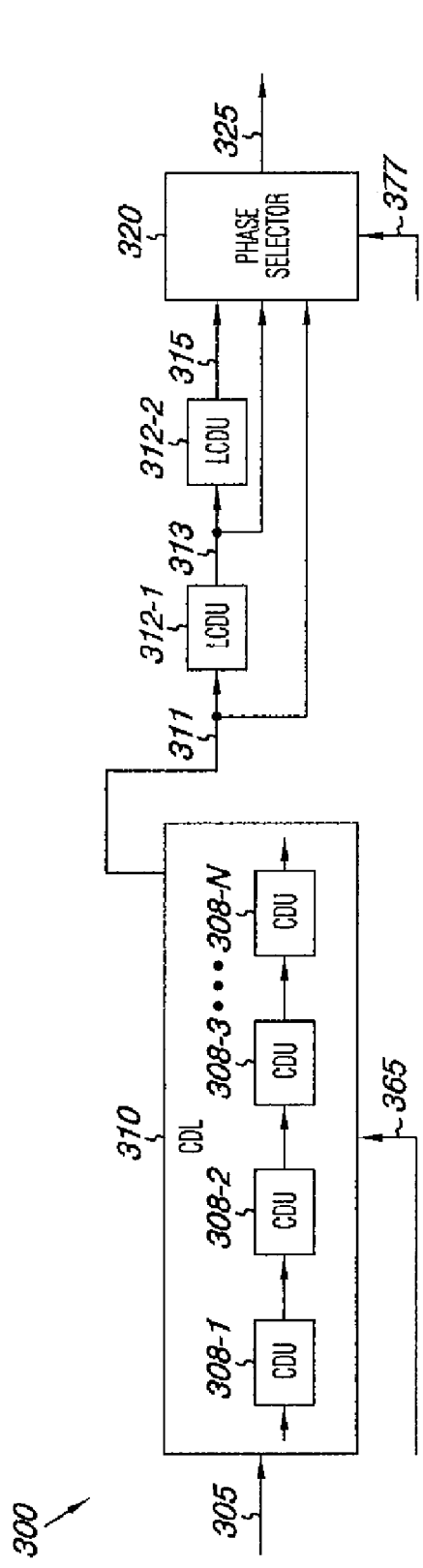
FIG. 3 illustrates an embodiment of an exit-point delay line system according to the present disclosure.

FIG. 3 illustrates an embodiment of an exit-point DL system 300 according to the present disclosure. The DL system 300 includes a CDL 310, a first local coarse delay unit (LCDU) 312-1, a second LCDU 312-2 and a phase selector 320. As will be explained in more detail below, while two LCDUs will be practical for many applications, embodiments may include more or fewer LCDUs. The CDL 310 includes a number of CDUs 308-1, 308-2, . . . 308-N. The LCDUs 312-1 and 312-2 are external to the CDL 310 and are connected together in series. The LCDUs 312-1 and 312-2 are considered "local" because they can be located local to or proximate to a phase mixer in a DL system, as described in connection with the embodiments of FIGS. 5 and 6. The DL system 300 can receive a clock reference signal 305 and generate a phase selector output signal 325 in response to a CDL control signal 365 and a phase selector control signal 377.

The CDL 310 can receive the clock reference signal 305 and the CDL control signal 365. The CDL control signal 365 can vary a time delay of the CDL 310 by controlling remote coarse-shifting in the CDL 310. In various embodiments, the CDL control signal 365 can be a shift register output signal, such as the shift register output signal 265 in the embodiment of FIG. 2. The CDL 310 can generate a CDL output signal 311, which can be based on the clock reference signal 305 and can include a time delay of the CDL 310. In some embodiments, the CDL 310 can generate both an odd CDL output signal and an even CDL output signal, such as the odd CDL output signal 215-O and the even CDL output signal 215-E in the embodiment of FIG. 2.

The first LCDU 312-1 can receive the CDL output signal 311 and generate a first LCDU output signal 313, which can be based on the CDL output signal 311 and can include a time delay of the first LCDU 312-1. In various embodiments, the time delay of the first LCDU 312-1 can be the same as a time delay of one or more of the CDUs 308-1, ... 308-N and/or a time delay of the second LCDU 312-2.

The second LCDU 312-2 can receive the first LCDU output signal 313 and generate a second LCDU output signal 315, which can be based on the first LCDU output signal 313 and can include the time delay of the second LCDU 312-2. In various embodiments, the time delay of the second LCDU 312-2 can be the same as a time delay of one or more of the CDUs 308-1, ... 308-N and/or a time delay of the first LCDU 312-1.

One or more LCDUs can be used in embodiments of the present disclosure. Embodiments with three or more LCDUs can include an initial LCDU, one or more internal LCDUs, and a final LCDU, with each LCDU external to a CDL and connected together in series. In such embodiments, the initial LCDU can receive an initial LCDU input signal, such as the CDL output signal 311 or a clock reference signal, such as a clock reference signal 405 as described in connection with the embodiment of FIG. 4. The initial LCDU can generate an output signal, which can be based on the initial LCDU input signal and can include a time delay of the initial LCDU. Each internal LCDU can receive an output signal from an LCDU prior in the series of LCDUs. For example, a first internal LCDU can receive the output signal from the initial LCDU. Each internal LCDU can also generate an output signal, which can be based on an output signal from an LCDU prior in the series and can include a time delay of that internal LCDU. The final LCDU can receive an output signal from a last internal LCDU in the series and can generate an output signal, which can be based on the output signal from the last internal LCDU and can include a time delay of the final LCDU.

The phase selector 320 can receive the CDL output signal 311, the first LCDU output signal 313, and the second LCDU output signal 315. The phase selector 320 can receive each of these signals to a particular phase selector input, from among a number of phase selector inputs. The phase selector 320 can also receive the phase selector control signal 377. In some embodiments with three or more LCDUs, a phase selector can receive output signals from a CDL, an initial LCDU, each internal LCDU, and a final LCDU to particular phase selector inputs, from among a number of phase selector inputs. In other embodiments with three or more LCDUs, a phase selector can receive output signals from a clock reference signal, an initial LCDU, each internal LCDU, and a final LCDU to particular phase selector inputs, from among a number of phase selector inputs.

The phase selector 320 can couple a phase selector input for the CDL output signal 311 or the first LCDU output signal 313 or the second LCDU output signal 315 to a phase selector output for use as a phase selector output signal 325, in response to the phase selector control signal 377. In various embodiments, the phase selector control signal 377 can be can be a control unit output signal, such as a first control unit output signal 577 as described in the embodiment of FIG. 5. In embodiments with three or more LCDUs, a phase selector can couple one of the signals received to particular phase selector inputs to a phase selector output in response to a phase selector control signal. In some embodiments, the phase selector 320 can produce the phase selector output signal 325 for a phase mixer, as described in the embodiment of FIG. 5.

Various embodiments of the present disclosure can include logic to coordinate remote coarse-shifting by the CDL 310 and changing the coupling of the phase selector output signal 325, to delay the transmission of the clock reference signal 305 with particular time delays for the DL system 300. Throughout this document, changing the coupling of a phase selector output signal in a DL system with LCDUs is referred to as "local coarse-shifting." For example, changing the coupling of the phase selector output signal 325 from the first LCDU output signal 313 to the CDL output signal 311, in response to the phase selector control signal 377 is a local coarse-shift. As another example, changing the coupling of the phase selector output signal 325 from the first LCDU output signal 313 to the second LCDU output signal 315, in response to the phase selector control signal 377 is also a local coarse-shift.

According to various embodiments, each of the CDUs 308-1, ..., 308-N and each of the LCDUs 312 and 314 have the same time delay, e.g., 200 picoseconds. In this example embodiment, combinations of CDUs and LCDUs may be used for time delays in 200 picosecond increments. For example, when the phase selector 320 couples the first LCDU output signal 313 as the output signal 325, the output signal 325 will include the time delay of the CDL 310, e.g. "X" picoseconds, plus the 200 picosecond time delay of the first LCDU 312-1. When the phase selector 320 couples the second LCDU output signal 315 as the output signal 325, the output signal 325 will include the time delay of the CDL 310, e.g. "X" picoseconds, plus the 200 picosecond time delay of the first LCDU 312-1, plus the 200 picosecond time delay of the second LCDU 312-2. In this example, combinations of the CDUs 308-1, ..., 308-N and the LCDUs 312 and 314 may be used for time delays of 200 or 400 picoseconds more than a time delay of the CDL 310. Thus, in this example, the phase selector 320 can receive phase selector input signals with time delays of X, X+200 picoseconds, and X+400 picoseconds. The phase selector 320 can then transmit one of these received signals as the phase selector output 325, in response to the phase selector control signal 377.

Such local coarse-shifts can consume significantly less power than remote coarse-shifts. For example, remote coarse-shifting can draw instantaneous current on the order of one milli-amp, which can introduce jitter to a clock output signal. In comparison, local coarse-shifting may draw instantaneous current on the order of 30 micro-amps. Hence, a local coarse-shift may have a much lower power supply demand for a DL and/or a DL system. By using a local coarse-shift instead of using a remote coarse-shift to vary a time delay of a DL system, embodiments of the present disclosure can reduce jitter in the delayed electrical signal generated by the DL and/or the DL system. Thus, local coarse-shifting can vary a time delay of the DL system 300 in increments of the time delays for the LCDUs 312-1 and 312-2, without remote coarse-shifting, thus ameliorating issues associated with remote coarse-shifting in a DL and/or a DL system.

Figure 4:
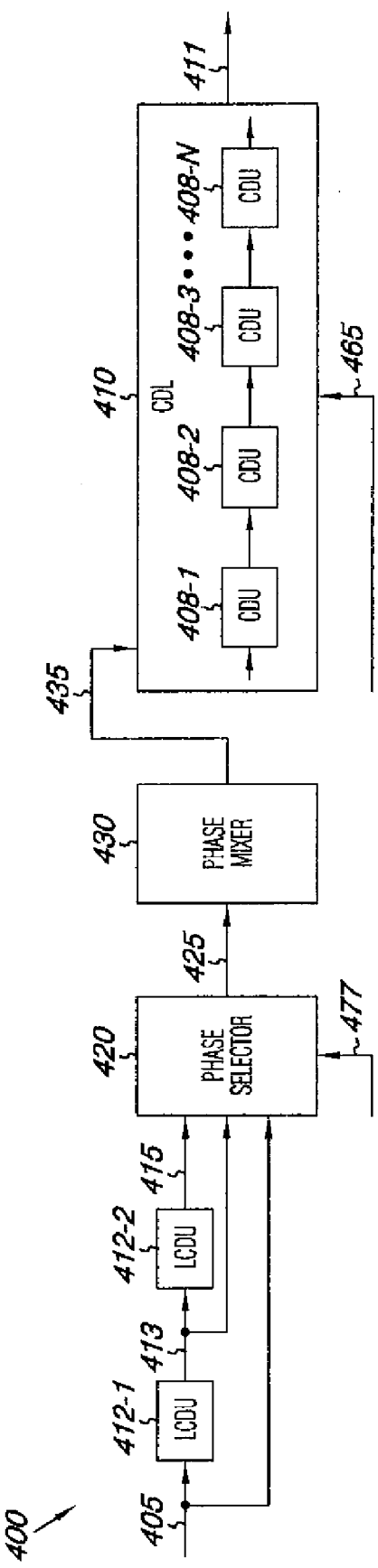
FIG. 4 illustrates an embodiment of an entry-point delay line system according to the present disclosure.

FIG. 4 illustrates an embodiment of an entry-point DL system 400 according to the present disclosure. The DL system 400 includes a first LCDU 412-1, a second LCDU 412-1-2, a phase selector 420, a phase mixer 430, and a CDL 410. The CDL 410 includes a number of CDUs, 408-1, 408-2, ..., 408-N, connected together in a line of CDUs. The LCDUs 412-1 and 412-1-2 are external to the CDL 410 and are connected together in series. The DL system 400 can receive a clock reference signal 405 and generate a CDL output signal 411 in response to a CDL control signal 465 and a phase selector control signal 477 as described in connection with FIG. 3.

The phase selector 420 can receive the clock reference signal 405, the first LCDU output signal 413, and the second LCDU output signal 415 to particular phase selector inputs, from among a number of phase selector inputs. The phase selector 420 can also receive the phase selector control signal 477. The phase selector 420 can couple the clock reference signal 405 or the first LCDU output signal 413 or the second LCDU output signal 415 to a phase selector output as a phase selector output signal 425, in response to the phase selector control signal 477. The phase mixer 430 can generate a phase mixer output signal 435, which can be based on the phase selector output signal 425 and can include a time delay of the phase mixer 430, as described in connection with the embodiment of FIG. 5. The CDL 410 can receive the phase mixer output signal 435 and the CDL control signal 465, which can vary a time delay of the CDL 410 by controlling remote coarse-shifting in the CDL 410.

Various embodiments of the present disclosure can include logic to coordinate local coarse-shifting with the phase selector 420, fine-shifting with the phase-mixer 430, and remote coarse-shifting by the CDL 410, to delay the transmission of the clock reference signal 405 with particular time delays for the DL system 400, as described in connection with the embodiments of FIGS. 3 and 5. Thus, local coarse-shifting can vary a time delay of the DL system 400 in increments of the time delays for the LCDUs 412-1 and 412-1-2, without remote coarse-shifting and the potential issues associated with remote coarse-shifting in a DL 410 and/or a DL system.

Figure 5:
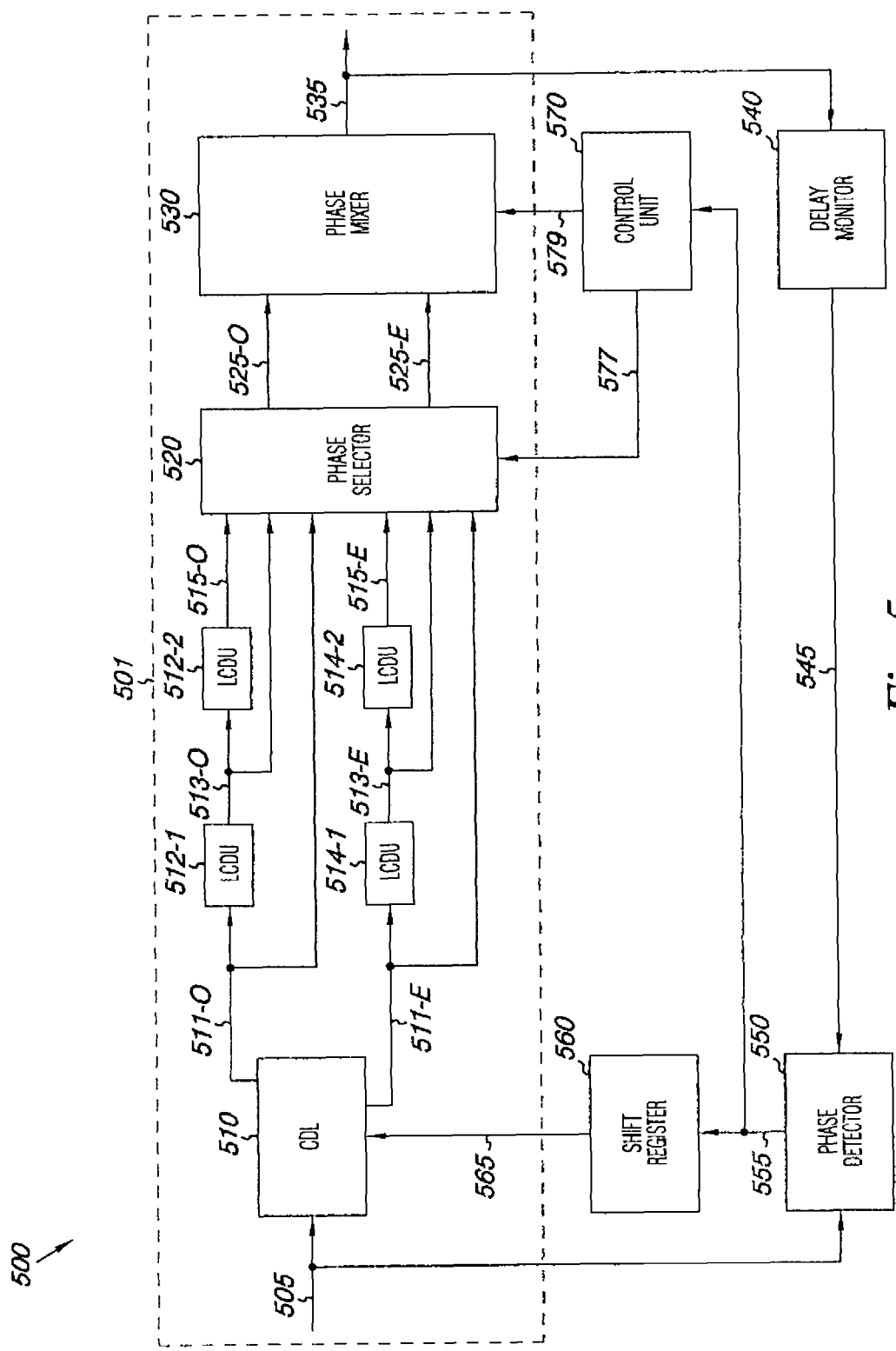
FIG. 5 illustrates an embodiment of a DLL circuit with an exit-point delay line system according to the present disclosure.

FIG. 5 illustrates an embodiment of a DLL circuit 500 with an exit-point DL system according to the present disclosure. The DLL circuit 500 can include elements of the DLL circuit 200 of the embodiment of FIG. 2 along with elements of the DL system 300 of the embodiment of FIG. 3. The DLL circuit 500 includes a CDL 510, a first odd LCDU 512-1, a second odd LCDU 512-2, a first even LCDU 514-1, a second even LCDU 514-2, a phase selector 520, and a phase mixer 530, which together can be considered a DL system 501 within the DLL circuit 500. In various embodiments, one or more LCDUs may be used, as described in connection with the embodiment of FIG. 3. The DLL circuit 500 also includes a delay monitor 540, a phase detector 550, a shift register 560, and a control unit 570. The DLL circuit 500 can phase lock a clock output signal 535 to a clock reference signal 505 by using electrical elements included in the DLL circuit 500.

The DL system 501 can receive the clock reference signal 505 and can generate the clock output signal 535 as described in detail below. The delay monitor 540 can receive the clock output signal 535 and can generate a delay monitor output signal 545. The phase detector 550 can receive the clock reference signal 505 and the delay monitor output signal 545, and can generate a phase detector output signal 555. The shift register 560 can receive the phase detector output signal 555 and can generate the shift register output signal 565. The control unit 570 can receive the phase detector output signal 555 and can generate the first control unit output signal 577 and the second control unit output signal 579.

The DL system 501 can receive the clock reference signal 505 to the CDL 510. The CDL 510 can also receive the shift register signal 565, which can control remote coarse-shifting in the CDL 510. The CDL 510 can generate an odd CDL output signal 511-O and an even CDL output signal 511-E, each of which can be based on the clock reference signal 505 and can include a time delay of the CDL 510. Again, an example of an exit-point CDL generating an odd CDL output signal and an even CDL output signal is provided in co-pending commonly assigned US Applications having Ser. Nos. 11/349,397 and 11/186,548. In the embodiment of FIG. 5, the CDL 510 is shown as an exit point CDL, such as the CDL 310 of the embodiment of FIG. 3. However, in various embodiments the DL system 501 can use an entry point CDL, as described in connection with the embodiment of FIG. 4.

The first odd LCDU 512-1 can receive the odd CDL output signal 511-O and generate a first odd LCDU output signal 513-O, which can be based on the CDL output signal 511-O and can include a time delay of the first odd LCDU 512-1. In this manner, the first odd output signal 513-O includes a variable time delay of the odd CDL output signal 513-O, e.g., time delay "XO" plus the time delay of the first odd LCDU 512-1. In various embodiments, the time delay of the first odd LCDU 512-1 can be the same as a time delay of one or more CDUs in the CDL 510.

The second odd LCDU 512-2 can receive the first odd LCDU output signal 513-O and generate a second odd LCDU output signal 515-O, which can be based on the first odd LCDU output signal 513-O and can include the time delay of the second odd LCDU 512-2. In this manner, the second odd LCDU 512-2 output signal 515-O includes a variable time delay of the odd CDL output signal 513-O, e.g., time delay "XO", plus the time delay of the first odd LCDU 512-1, plus the time delay of the second odd LCDU 512-2. In various embodiments, the time delay of the second odd LCDU 512-2 can be the same as a time delay of one or more CDUs in the CDL 510 and/or a time delay of the first odd LCDU 512-1.

Similarly, the first even LCDU 514-1 can receive the even CDL output signal 511-E and generate a first even LCDU output signal 513-F including a variable time delay of the even CDL output signal 511-E, e.g., time delay "XE" plus a time delay of the first even LCDU 514-1. The second even LCDU 514-2 can receive the first even output signal 513-E and generate a second even output signal 515-E including a variable time delay of the even CDL output signal 513-E, e.g., time delay "XE", plus the time delay of the first even LCDU 514-1, plus a time delay of the second even LCDU 514-2.

The phase selector 520 can receive the odd CDL output signal 511-O, the first odd LCDU output signal 513-O, the second odd LCDU output signal 515-O, the even CDL output signal 511-E, the first even LCDU output signal 513-E, and the second even LCDU output signal 515-E. The phase selector 520 can receive each of these signals to particular phase selector inputs, from among a number of phase selector inputs. The phase selector 520 can also receive the first control unit output signal 577. The phase selector 520 can couple the odd CDL output signal 511-O or the first odd LCDU output signal 513-O or the second odd LCDU output signal 515-O as a phase selector odd output signal 525-O, in response to the first control unit output signal 577. The phase selector 520 can also couple the even CDL output signal 511-E or the first even LCDU output signal 513-E or the second even LCDU output signal 515-E as a phase selector even output signal 525-E, in response to the first control unit output signal 577. Thus, the first control unit output signal 577 can control local coarse-shifting with the phase selector 520 by selecting a particular one of the odd CDL output signal 511-O or the first odd LCDU output signal 513-O or the second odd LCDU output signal 515-O as a phase selector odd output signal 525-O and by selecting a particular one of the even CDL output signal 511-E or the first even LCDU output signal 513-E or the second even LCDU output signal 515-E as a phase selector even output signal 525-E.

In various embodiments, the DLL circuit 500 can include logic to coordinate remote coarse-shifting by the CDL 510 and/or local coarse-shifting with the phase selector 520 and/ or fine-shifting by the phase mixer 530 across fine-to-coarse time delay boundaries. As an example, a CDL 510 may use a line of ninety-six (96) CDUs, with each CDU alternately coupled to produce an odd CDL output signal 551-O or an even CDL output signal 511-E. Each CDU in the CDL 510 may have an example time delay of 200 picoseconds such that stepping forward or backward in the CDL 510 between alternating "even" and "odd" CDUs can introduce or remove a variable time delay for the CDL 510 in increments of 200 picoseconds. As shown in the embodiment of FIG. 5 the CDL 510 is also coupled to the phase mixer 530 which performs a fine adjust function or serves as a fine adjust circuit in place of a FDL. According to various embodiments, the phase mixer 530 may further be capable of providing eight (8) additional fine time delay adjustments in time delay increments of 12.5 picoseconds for each of the phase selector odd output signals 525-O or the phase selector even output signals 525-E depending on which output signal 525-O or 525-E is the leading signal, respectively. This provides an additional range of eight (8) additional fine adjust time delays, e.g., in 12.5 picosecond increments from the phase mixer 530. Again, an example of an exit-point CDL generating an odd CDL output signal and an even CDL output signal together with a phase mixer for performing "fine adjust" is provided in co-pending commonly assigned US Applications having Ser. Nos. 11/349,397 and 11/186,548.

In various embodiments, the control logic provided to the phase selector 520 by the first control unit output signal 577 and to the phase mixer 530 by the second control unit output signal 579 may establish a "beginning point" such that the phase selector odd output signal 525-O provided to the phase mixer 530 is the first odd LCDU output signal 513-O and such that the phase mixer 530 begins with zero (0) additional "odd" fine time delays added thereto when the odd output signal 525-O is the leading edge signal. The phase mixer 530 then has the capability to add eight (8) additional fine steps to the odd phase by blending the odd phase (signal 525-O) with the leading even phase, based on the second control unit 579, in determining the phase mixer output signal 535.

Similarly, the control logic provided to the phase selector 520 by the first control unit output signal 577 and to the phase mixer 530 by the second control unit output signal 579 may establish a "beginning point" such that the phase selector even output signal 525-E provided to the phase mixer 530 is the first even LCDU output signal 513-E and such that the phase mixer 530 begins with zero (0) additional "even" fine time delays added thereto when the even output signal 525-E is the leading edge signal. The phase mixer 530 then has the capability to add eight (8) additional fine steps to the odd phase by blending the even phase (signal 525-E) with the leading even phase, based on the second control unit 579, in determining the phase mixer output signal 535.

As the reader will appreciate, the "beginning point" coincides with a fine-to-coarse adjust boundary where a remote coarse-shift time delay, via adding or removing a CDU in the CDL 510, has just been performed and the phase selector 520 once again selects the first LCDU 512-1/514-1 as the output signal 525-O or 525-E and this signal is provided to a "center" of the phase mixer 530, e.g., reset to zero (0) additional fine adjust time delays for outputs signal 535. However, this presents the issue that with previous fine-to-coarse DLL topology, there exists the potential for the delay line to lock on a fine-to-coarse boundary. Given some amount of jitter on the input clock, it is difficult to prevent slight change in the lock point. If these changes cause the system to move back and forth across the fine-to-coarse boundary, the CDL 510 will more frequently cause the large drivers for shifting remote CDUs into and out of the CDL 510 to fire. As described in the above example embodiments of FIGS. 3 and 4, by virtue of the LCDUs, 512-1, 512-2/514-1, 514-2, a local-coarse shifting can be performed first as a preemptive measure to firing the large drivers for shifting remote CDUs into and out of the CDL 510.

Figure 6A:
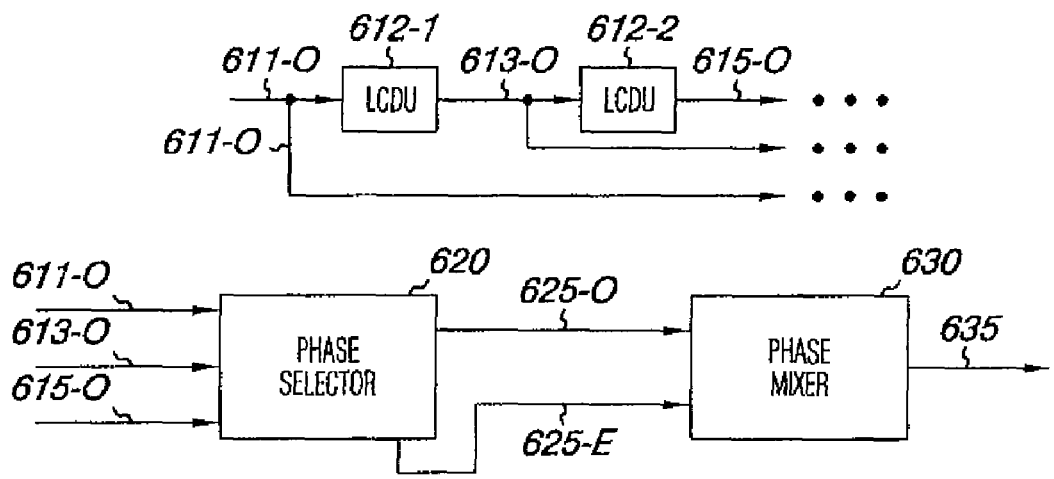
FIG. 6A illustrates an embodiment of a portion of the "odd" output signals from the CDL and the first and second LCDUs in FIG. 5 being provided to a phase selector coupled to a phase mixer.

FIG. 6A illustrates an embodiment of a portion of the "odd" output signals from the CDL and the first and second LCDUs in FIG. 5 being provided to a phase selector coupled to a phase mixer. As shown in FIG. 6A, a number of local CDUs (LCDUs) 612-1/612-2 are provided proximate to a phase mixer 630. The number of LCDUs 612-1/612-2 can provide a number of inputs to a phase selector 620. The phase selector, based on control signals described above, selects a particular one of the odd CDL output signal 611-O, the first odd LCDU output signal 613-O, or the second odd LCDU output signal 615-O as a phase selector odd output signal 625-O. The phase selector odd output signal 625-O is provided to the phase mixer for fine adjust, which is mixed (or blended) with the even output signal 625-E, in creating output signal 635.

Figure 6B:
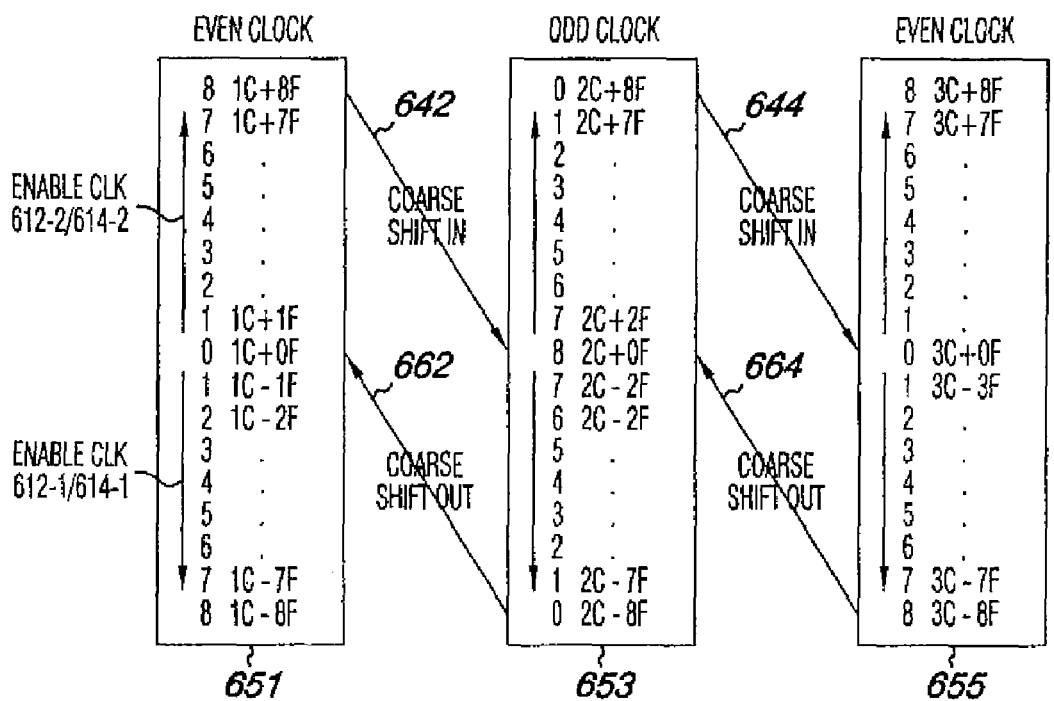
FIG. 6B illustrates an embodiment of logic rules for when a remote coarse-shift is performed versus a local coarse-shift.

FIG. 6B illustrates an embodiment of logic rules for remote coarse-shifting and local coarse-shifting in the DL system 501 of the embodiment of FIG. 5. The logic rules include a first state diagram 651, a second state diagram 653, and a third state diagram 655. The first state diagram 651 and the third state diagram represent states in which an even clock signal is leading in the DLL circuit 500 and the second state diagram represents states in which an odd clock signal is leading in the DLL circuit 500. FIG. 6B illustrates a remote coarse shift in 642, a remote coarse shift in 644, a remote coarse shift out 642, and a remote coarse shift out 662. Also in FIG. 6B, enable clock 612-2/614-2 and enable clock 612-2/614-2 illustrate embodiments for local coarse-shifting, as described below.

The first state diagram 651 illustrates first states of time delays in the DL system 501. The first states of time delays includes time delays of one CDU (e.g. "1C") that is remote coarse-shifted into the CDL 510 and various numbers of FDUs (e.g. 8F ... −8F) that are fine-shifted using the phase mixer 530 and local coarse shifts. In the embodiment of FIG. 6B, 1C+0F represents a time delay of one CDU in the CDL 510 plus a time delay from a center FDU (0F) at a center of a range of fine-delays in the phase mixer 530. For the FDU time delays, a "+" represents a time delay greater than the time delay of the center FDU and a "−" represents a time delay less than the time delay of the center FDU. Thus, 1C+7F represents a time delay of one CDU in the CDL 510 plus a time delay seven FDUs greater than the time delay of the center FDU. Similarly, 1C−2F represents a time delay of one CDU in the CDL 510 plus a time delay two FDUs less than the time delay of the center FDU. This nomenclature is similarly used in the second state diagram 653 and the third state diagram.

The second state diagram 653 illustrates second states of time delays in the DL system 501. The second states of time delays include time delays of two CDUs (e.g. "2C") that are remote coarse-shifted into the CDL 510 and various numbers of FDUs (e.g. 8F . . . –8F) that are fine-shifted into the phase-mixer 530. The third state diagram 655 illustrates third states of time delays in the DL system 501. The third states of time delays include time delays of three CDUs (e.g. "3C") that are remote coarse-shifted into the CDL 510 and various numbers of FDUs (e.g. 8F . . . –8F) that are fine-shifted into the phase-mixer 530.

In the embodiment of FIG. 6B, the time delay of eight FDUs in the phase-mixer 530 is equal to the time delay of one CDU in the CDL 510. As a result, fine-shifting eight FDUs using the phase-mixer 530 in exchange for remote coarse-shifting one CDU out of the CDL 510 results in no change to the time delay of the DL system 501. Conversely, fine-shifting eight FDUs out of the phase-mixer 530 in exchange for remote coarse-shifting one CDU into the CDL 510 also results in no change to the time delay of the DL system 501. This relationship between the time delays of the FDUs and the time delays of the CDUs governs the remote coarse shifts shown in FIG. 6B.

The remote coarse shift in 642 represents a change in the DL system 501 from a time delay of the first states to a time delay of the second states. In the remote coarse shift in 642, the state is changed from a first state of 1C+8F to a second state of 2C+0F, by fine-shifting eight FDUs out of the phase-mixer 530 in exchange for remote coarse-shifting one CDU into the CDL 510, resulting in no change to the time delay of the DL system 501. Similarly, the remote coarse shift in 644 represents a change in the DL system 501 from a time delay of the second states to a time delay of the third states. In the remote coarse shift in 644, the state is changed from a second state of 2C+8F to a third state of 3C+0F, by fine-shifting eight FDUs out of the phase-mixer 530 in exchange for remote coarse-shifting one CDU into the CDL 510, resulting in no change to the time delay of the DL system 501. The remote coarse-shifts 642 and 644 represent coarse shifts across a coarse-to-fine-boundary in the DL system 501.

The remote coarse shift out 662 represents a change in the DL system 501 from a time delay of the second states to a time delay of the first states. In the remote coarse shift out 662, the state is changed from a second state of 2C–8F to a first state of 1C+0F, by fine-shifting eight FDUs into the phase-mixer 530 in exchange for remote coarse-shifting one CDU out of the CDL 510, resulting in no change to the time delay of the DL system 501. Similarly, the remote coarse shift out 664 represents a change in the DL system 501 from a time delay of the third states to a time delay of the second states. In the remote coarse shift in 664, the state is changed from a third state of 3C–8F to a second state of 2C+0F, by fine-shifting eight FDUs into the phase-mixer 530 in exchange for remote coarse-shifting one CDU out of the CDL 510, resulting in no change to the time delay of the DL system 501. The remote coarse-shifts 662 and 664 also represent coarse shifts across a coarse-to-fine-boundary in the DL system 501.

In the embodiment of FIG. 6B, local coarse-shifting can be performed at various states shown in the state diagrams 651, 653, and 655. In various embodiments, the time delays of the LCDUs 512-1, 512-2, 514-1, and 514-2 can be the same as time delays of CDUs in the CDL 510. In such embodiments, a local-shift can be performed instead of a remote coarse-shift to obtain the same time delay in the DL system 501. As a result, if the DLL circuit 500 phase locks on a fine-to-coarse boundary, local coarse-shifting can be performed, in order to avoid issues associated with remote coarse-shifting in the DL system 501, as described above.

In some embodiments, logic in the DLL circuit 500 can coordinate the performance of a local coarse-shift at a state that is a "beginning point;" a state in which eight FDUs are switched into the phase mixer 530 (e.g. "+8F"). For example, the embodiment of FIG. 6B includes a first state of 1C+8F and a second state of 2C+8F, which are beginning points. At such beginning points, logic can coordinate the performance of a local coarse-shift, in which a coupling of signals in the phase selector is changed to add a time delay of an LCDU to a time delay of the DL system 501 instead of performing a remote coarse-shift. As an example, the enable clock 612-2/614-2 can represent the first control unit output signal 577 as described in the embodiment of FIG. 5, which can control local-shifting so that a time delay of an LCDU such as the LCDUs 512-1, 512-2, 514-1, and 514-2, can be added instead of a time delay from a CDU in the CDL 510, to establish and/or maintain a phase lock in the DLL circuit 500.

Similarly, in some embodiments, logic in the DLL circuit 500 can coordinate the performance of a local coarse-shift at a state that is an "end point;" a state in which eight FDUs are switched out of the phase mixer 530 (e.g. "–8F"). For example, the embodiment of FIG. 6B includes a second state of 2C–8F and a third state of 3C–8F, which are end points. At such end points, logic can coordinate the performance of a local coarse-shift, in which a coupling of signals in the phase selector is changed to remove a time delay of an LCDU from a time delay of the DL system 501 instead of performing a remote coarse-shift. As an example, the enable clock 612-1/614-1 can also represent the first control unit output signal 577 as described in the embodiment of FIG. 5, which can control local-shifting so that a time delay of an LCDU such as the LCDUs 512-1, 512-2, 514-1, and 514-2, can be removed instead of a time delay from a CDU in the CDL 510, to establish and/or maintain a phase lock in the DLL circuit 500.

In various embodiments, logic in the DLL circuit 500 can also coordinate the performance of a local coarse-shift at various FDU thresholds. For example, logic can select one or more points at which a particular number of FDUs are switched into or out of the phase-mixer 530, and at which a local-shift can be performed.

Figure 7:
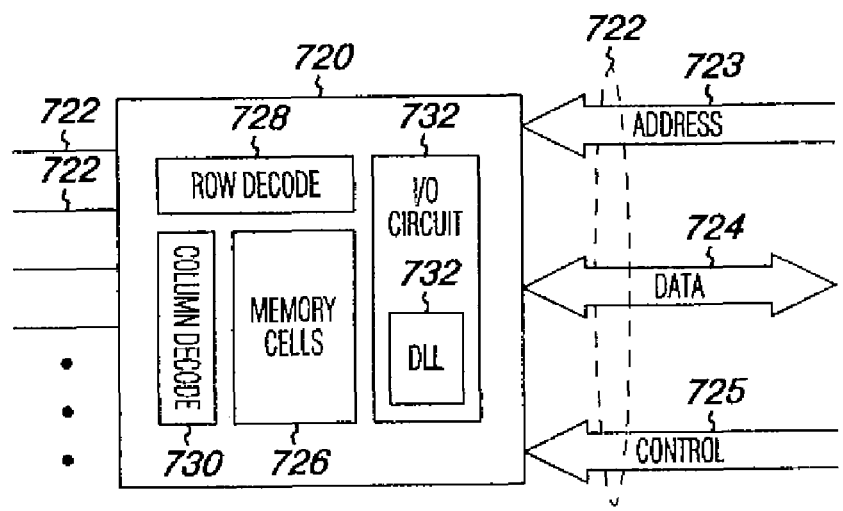
FIG. 7 illustrates a memory including a DLL circuit according to embodiments of the present disclosure.

FIG. 7 illustrates a memory 700 including a DLL circuit 732 according to embodiments of the present disclosure. The memory 700 illustrates a memory chip or memory device 720 including the DLL circuit 732 in which a DL system according to various embodiments, e.g., 300, 400, 500 in FIGS. 3, 4, and 5, can be used. The memory 720 may be part of a DIMM (dual in-line memory module) or a PCB (printed circuit board) containing many such memory devices. The memory device 720 may include a number of pins 722 located outside of the chip 720 for electrically connecting the chip to other system devices. Some of those pins 722 may constitute memory address pins or address bus 723, data pins or data bus 724, and control pins or control bus 725. As the reader will appreciate, each of the reference numerals 723-725 designates more than one pin 722 in the corresponding bus and are broadly designated as such only for ease of illustration.

A processor or memory controller, shown below in FIG. 7, may communicate with the chip 720 and perform memory read/write operations. The processor and the memory chip 720 may communicate using address signals on the address lines or address bus 723, data signals on the data lines or data bus 724, and control signals, e.g., a row address strobe (RAS) signals, a column address strobe (CAS) signal, etc. on the control lines or control bus 725. As the reader will appreciate, the "width", i.e., number of pins of address, data, and control buses may differ from one memory configuration to another. Additionally, numerous peripheral devices or circuits may be provided along with the memory chip 720 for writing data to and reading data from the memory cells 726. However, such peripheral devices or circuits are not shown to provide a less cluttered illustration.

The memory chip 720 may include a number of memory arrays 726 having memory cells arranged in rows and columns to store data. Each memory cell may store one or more bits of data. A row decode circuit 728 and a column decode circuit 730 may select the rows and columns in the memory array 726 in response to decoding an address provided on the address bus 723. Data to and from the memory arrays 726 is then transferred over the data bus 724 via sense amplifiers and a data output path, as the same are know and understood. A memory controller, shown in FIG. 7, may provide relevant control signals on the control bus 725 to control data communication to and from the memory chip 720 via an I/O (input/output) circuit 732. The I/O circuit 732 may include a number of data output buffers, as the same are known, to received the data bits from the memory arrays 726 and provide those data bits or data signals to the corresponding data lines in the data bus 724. As noted above, the I/O circuit may include a clock synchronization or DLL circuit 732 having a delay line according to various embodiments, e.g., 300, 400, 500 in FIGS. 3, 4, and 5, to synchronize the external system clock, e.g., the clock used by the memory controller to clock address, data and control signals between the memory chip 720 and the controller or processor, with the internal clock used by the memory chip 720 to perform data write/read operation on the memory arrays 726.

Figure 8:
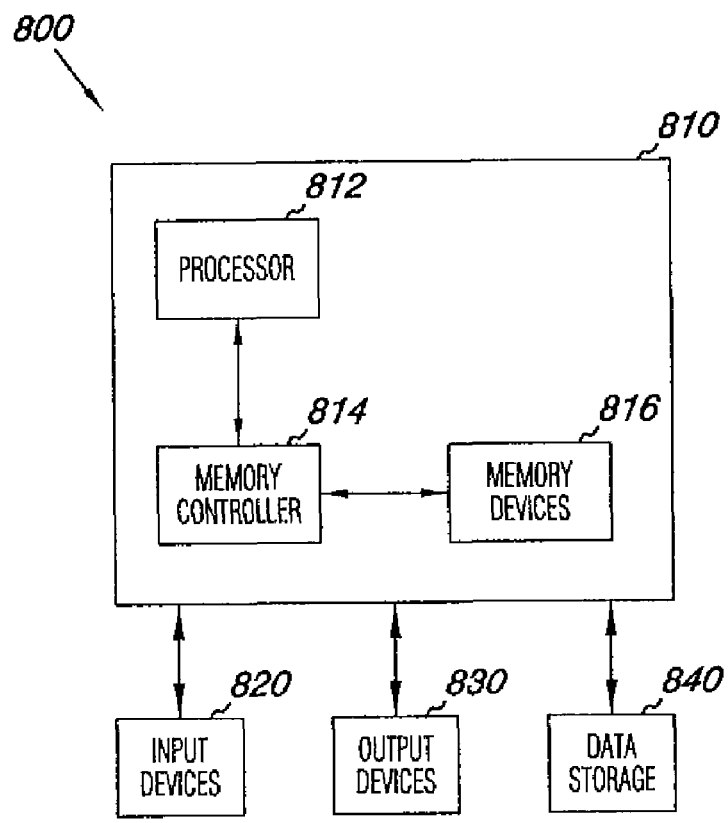
FIG. 8 illustrates a system including a memory according to embodiments of the present disclosure.

The memory controller, shown in FIG. 8, may determine the modes of operation of the memory chip 720. Some example of the input signals or control signals on the control bus 725 include and external clock signal, a chip select signal, a RAS signal, a CAS signal, a write enable signal, etc. The memory chip communicates to other devices connected thereto via the pins 722 on the chip 720. These pins, as mentioned above, may be connected to appropriate address, data, and control lines, 723, 724, and 725 respectively, to carry out data transfer, i.e., transmission and reception, operations.

FIG. 7 illustrates a system 700 including a memory according to embodiments of the present disclosure. That is, at least one of the memory devices 716 can include a DLL circuit with a DL system for local coarse-shifting, as described according to embodiments of the present disclosure. The system 800 includes a computing unit 810 with a processor 812, a memory controller 814, and the memory devices 816. The system 800 also includes input devices 820, output devices 830, and data storage 840.

Elements of the system 800 can perform various functions. The processor 812 can perform various computing functions, such as executing instructions to perform calculations or process data. The memory controller 814 can control communications to and from the memory devices 816, in response to control signals received from the processor 812. The memory devices 816 can transmit and receive data through the memory controller 814, and can also store such data.

The memory devices 816 can be various types of memory. For example, the memory devices 816 can be dynamic random access memory (DRAM), static random access memory (SRAM), flash memory, etc. DRAM embodiments can be synchronous DRAM, also referred to as synchronous graphics random access memory (SGRAM), SDRAM, SDRAM II, or double data rate SDRAM (DDR SDRAM), as well as Synchlink or Rambus DRAM. One or more of the memory devices 816 can incorporate embodiments of the present disclosure for PLL locking, as described above.

The input devices 820, output devices 830, and data storage 840, can include one or more of various devices. For example, input devices can include a keyboard, a transceiver, a mouse, etc. The input devices 820 can be used by an individual, a device, or another system, to communicate with the system 800. As an example, output devices can include printers, video terminals, monitors, display units, etc. The output devices can be used by the system 800 to communicate with an individual, with a device, or with another system. Examples of data storage can include hard disks, floppy disks, CDs, DVDs, and other media. The data storage 840 can be used to store various data.

The processor 812, the memory controller 814, and the memory devices 816 can be connected by one or more circuits, such as a bus (not shown). The input devices 820 and the output devices 830 can be internal to or external from the computing unit 810, in various embodiments. The data storage 840 can be provided to the computing unit 810 in various devices, such as disk drives, for reading from and/or writing to such data storage. Such devices and storage can be connected to the computing unit 810 in various ways, such as wired or wireless connections, using one or more open and/or proprietary communication protocols.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A delay locked loop circuit, comprising:
 a delay line system, configured to generate a clock output signal by adding a delay line system time delay to a clock reference signal, wherein the delay line system includes:
  a coarse delay line configured to adjust the delay line system time delay by remote coarse-shifting;
  a phase selector configured to adjust the delay line system time delay by local coarse-shifting output signals from a series of local coarse delay units; and
  a phase mixer configured to adjust a particular time delay of the clock output signal by fine-shifting, wherein the phase mixer does not receive the clock reference signal; and a phase detector configured to detect a phase difference between the clock reference signal and the clock output signal;

a shift register configured to control the remote coarse-shifting based on the phase difference; and a control unit configured to control the local coarse-shifting based on the phase difference.

2. The delay locked loop circuit of claim 1, wherein the control unit is configured to control the fine-shifting based on the phase difference.

3. The delay locked loop circuit of claim 1, wherein the control unit is configured to local coarse-shift with the phase selector to phase lock the clock output signal to the clock reference signal.

4. The delay locked loop circuit of claim 3, wherein the shift register is configured to remote coarse-shift with the coarse delay line to phase lock the clock output signal to the clock reference signal, after the control unit local coarse-shifts.

5. The delay locked loop circuit of claim 1, wherein the phase mixer is arranged to have its input coupled to an output of the phase selector.

6. The delay locked loop circuit of claim 5, wherein the phase mixer is arranged to have its output coupled to an input of the coarse delay line.

7. The delay locked loop circuit of claim 1, wherein the phase mixer is arranged to have its output coupled to an input of the coarse delay line.

8. A delay locked loop circuit, comprising:
a coarse delay line configured to adjust a time delay of the delay locked loop circuit with respect to a clock reference signal by remote coarse-shifting;

a phase selector configured to adjust the time delay by local coarse-shifting output signals from a series of local coarse delay units;

a phase mixer configured to adjust the time delay by fine-shifting, wherein the phase mixer does not receive the clock reference signal; and logic to maintain a phase lock of the delay locked loop circuit by local coarse-shifting inside a time delay range of the series of local coarse delay units and remote coarse-shifting outside the time delay range of the series of local coarse delay units.

9. The delay locked loop circuit of claim 8, wherein the coarse delay line includes a number of coarse delay units, each with a same particular time delay.

10. The delay locked loop circuit of claim 9, wherein each of the local coarse delay units has the same particular time delay.

11. The delay locked loop circuit of claim 8, wherein each of the local coarse delay units has a same particular time delay.

12. The delay locked loop circuit of claim 8, wherein:
the coarse delay line is an exit-point coarse delay line; and
there are two local coarse delay units in the series of local coarse delay units.

13. The delay locked loop circuit of claim 8, further including logic to local coarse-shift to a center of the time delay range of the series of local coarse delay units while the delay locked loop circuit is phase locking.

14. The delay locked loop circuit of claim 8, wherein the phase mixer is arranged to have its input coupled to an output of the phase selector.

15. The delay locked loop circuit of claim 8, wherein the phase mixer is arranged to have its output coupled to an input of the coarse delay line.

16. A delay locked loop circuit, comprising:
a number of coarse delay units (CDUs) in a coarse delay line (CDL) to provide a variable time delay; and a number of local coarse delay units (LCDUs), to receive an output of the CDL, proximate to a phase mixer; and a phase selector having an output signal provided to the phase mixer and configured to receive an output signal from the CDL and an output signal from at least one of the number of LCDUs;

wherein a clock reference signal received by at least one of the number of CDUs in the CDL is not received by the phase mixer.

17. The delay locked loop circuit of claim 16, wherein the number of LCDUs are configured to control a remote coarse-shift adjust in the clock output signal outside of the number of CDUs in the CDL.

18. The delay locked loop circuit of claim 16, wherein the LCDUs are located topologically proximate to a fine adjust circuit on a synchronization integrated circuit (IC).

19. The delay locked loop circuit of claim 16, wherein:
a first output signal of the CDL is provided to a first LCDU in series with a second LCDU; and a second output signal of the CDL is provided to a third LCDU in series with a fourth LCDU.

* * * * *